(12) United States Patent
Wittman (10) Patent No.: US 7,741,828 B2
(45) Date of Patent: Jun. 22, 2010

(54) POWER DISTURBANCE DETECTION CIRCUIT AND METHOD

(75) Inventor: Brian Albert Wittman, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 662 days.

(21) Appl. No.: 11/579,850

(22) PCT Filed: May 18, 2004

(86) PCT No.: PCT/US2004/015467

§ 371 (c)(1),
(2), (4) Date: Nov. 8, 2006

(87) PCT Pub. No.: WO2005/119275

PCT Pub. Date: Dec. 15, 2005

(65) Prior Publication Data

US 2007/0159227 A1    Jul. 12, 2007

(51) Int. Cl.
*G01R 19/00*    (2006.01)
*G01R 29/26*    (2006.01)
*G01R 23/20*    (2006.01)

(52) U.S. Cl. ............... 324/76.11; 324/620; 324/613
(58) Field of Classification Search ............... 324/76.11, 324/620, 613
See application file for complete search history.

(56) References Cited

U.S. PATENT DOCUMENTS 3,813,667 A * 5/1974 Smith .................. 340/521
5,019,995 A    5/1991 Saito et al.

FOREIGN PATENT DOCUMENTS

| DE | 3927518 | 2/1991 |
|----|---------|--------|
| DE | 4220778 | 1/1994 |
| EP | 0322705 | 7/1989 |
| EP | 0599438 | 6/1994 |
| EP | 0949759 | 10/1999 |

OTHER PUBLICATIONS

Search Report Dated Jan. 24, 2005 PCT/US2004/015467.

* cited by examiner

*Primary Examiner*—Amy He
(74) *Attorney, Agent, or Firm*—Robert D. Shedd; Harvey D. Fried; James McKenzie (57) ABSTRACT

A method and apparatus are disclosed for detecting disturbances in an alternating current (AC) supply. A method includes a step of indicating a relationship between supplied AC voltage and a threshold voltage for at least a portion of each cycle of the supplied AC voltage. A circuit for detecting disturbances in supplied alternating current (AC) is provided. The circuit includes a threshold detector coupled to a source of supplied AC. The threshold detector provides a signal indicating a relationship of the supplied AC levels to a threshold level for at least a portion of each cycle of the supplied AC.

10 Claims, 6 Drawing Sheets

POWER DISTURBANCE DETECTION CIRCUIT AND METHOD

This application claims the benefit, under 35 U.S.C. §365 of International Application PCT/US04/15467 filed May 18, 2004, which was published in accordance with PCT Article 21(2) on Dec. 15, 2005 in English.

FIELD OF THE INVENTION

The present invention generally relates to alternating current (AC) power supplies, and more particularly, to a power disturbance detection circuit for electrically powered devices and systems.

BACKGROUND OF THE INVENTION

Many electronic and electrical devices, for example, recording devices such as personal video recorders (PVRs), set top boxes (STBs), personal computers (PCs), and the like, rely on undisturbed alternating current (AC) derived power to complete critical system operations. AC power sources can suffer from a variety of long-term and transient disturbances. The term "power disturbance", as used herein, refers to any out of tolerance condition of AC power input to any electrical, electromechanical or electronic device. Out of tolerance conditions include out of regulation conditions. Examples of power disturbances include variations in the frequency and/or amplitude of the input power. Though the former is usually acceptably stable, amplitude variations occur frequently. Unfortunately, in some cases AC power is lost altogether.

Computer systems, set top boxes, PVRs, DVD and CD recorders, etc. typically employ various memory devices to store program and system information. Memory devices include hard disk drives, recordable disks, semiconductor memory devices and the like. A power failure, brownout, or other disturbance can occur at any time. When power is disturbed in the middle of a memory write operation, data in the memory is sometimes corrupted. In some cases, a device will fail to operate after a power disturbance. For example a computer will sometimes fail to boot up because critical system information stored in memory was corrupted when a power disturbance interrupted a write operation. In addition, many electro-mechanical devices rely on undisturbed power to complete critical mechanical movements. Therefore, vulnerability to power disturbances remains a problem for many electronic, electrical and electro-mechanical devices.

Some conventional systems attempt to solve the problem by means of an early power fail (EPF) warning circuit to indicate an impending power disturbance. Existing EPF warning approaches typically rely upon voltage monitoring of a power supply output to detect disturbances. This approach has drawbacks. A switch-mode power supply, for example, may stay in regulation for some time after the input AC voltage drops, due to the charge held on its input capacitor. Therefore, any warning based on a decrease in output voltage level is delayed in time from the actual occurrence of the corresponding power disturbance. This delay time is typically a function of the discharge time constant of the input capacitor. Because of this delay time, prior art approaches often fail to provide adequate advance warning of an AC power disturbance.

Accordingly, circuits and methods are needed that are capable of indicating a power disturbance with decreased delay.

SUMMARY OF THE INVENTION

The present invention provides methods and apparatus for detecting disturbances in an alternating current (AC) supply. A method of the invention includes a step of indicating a relationship between supplied AC voltage and a threshold voltage for at least a portion of each cycle of the supplied AC voltage. A circuit for detecting disturbances in supplied alternating current (AC) is also provided. The circuit includes a threshold detector coupled to a source of supplied AC. The threshold detector provides a signal indicating a relationship of supplied AC levels to a threshold level for at least a portion of each cycle of the supplied AC.

BRIEF DESCRIPTION OF THE DRAWINGS

Embodiments of the present invention will be described below in more detail, with reference to the accompanying drawings, in which.

DETAILED DESCRIPTION

The invention detects AC input power disturbances. The term "power disturbance", as used herein, refers to any out of tolerance condition of an AC power signal. For purposes of this specification, the term "out of tolerance" refers to any condition wherein a parameter of an AC power supply input is outside a specified limit for proper operation of a device. According to an embodiment of the invention, imits are specified by at least one threshold value and implemented according to their appropriate choice and sizing of circuit components, for example, resistor values and diode ratings. AC power signals are characterized and measured by a variety of parameters including, AC peak voltage, AC Root Mean Square (RMS) voltage, AC average voltage, AC peak-to-peak voltage, and frequency, among other possible measures. The invention relates to detecting disturbances in AC power signals according to at least one of the above measures. In one embodiment of the invention, detection of power disturbance occurs within one alternating current cycle time following the disturbance.

Figure 1:
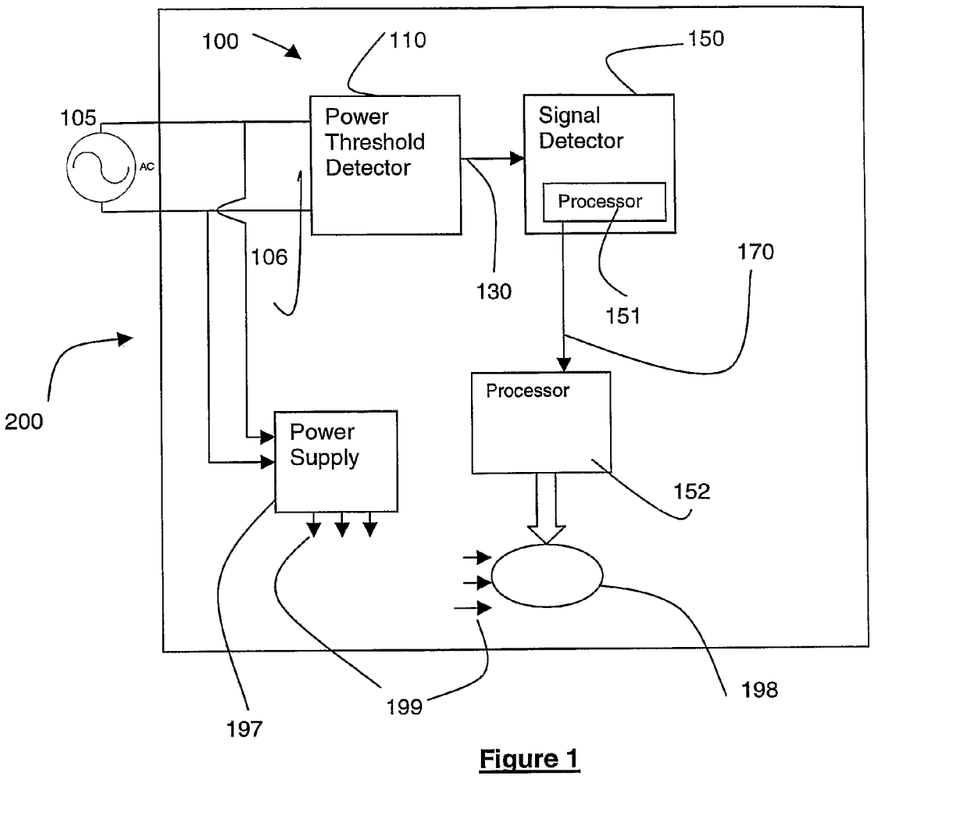
FIG. 1 is a block diagram of an electrical device includes a power disturbance detection circuit according to one embodiment of the invention.

FIG. 1 is a block diagram of a device 200 including power disturbance detection circuit 100 according to one embodiment of the invention. Device 200 represents any device relying on AC power for at least at least one function of the device. In an embodiment of the invention device 200 is selected from the group comprising set-top boxes, computers, DVD recorders, PVRs, televisions and similar electronic apparatus. In one embodiment of the invention, power disturbance detection circuit 100 is implemented within an AC power supply 197. AC power supply 197 is commonly found in many electronic devices and provides regulated voltages 199 for operation of device 200 based upon AC power supplied by source 105.

The invention does not rely on any particular placement of the detection circuit within, or external to device 200. Rather, the invention is suitable for implementation in any location convenient for coupling device 200 to AC power source 105.

In the illustrated embodiment, circuit 100 comprises a threshold detector 110 coupled to a signal detector and analyzer 150. AC power source 105 is coupled to the input 106 of threshold detector 110. AC input 106 is also coupled to an AC supply input to power supply 197. A signal relating to the presence of AC power at supply input 106 is provided by threshold detector 110 at an output 130. According to an embodiment of the invention threshold detector 110 provides a "threshold" signal to indicate when an undisturbed AC waveform is present at input 106. If a disturbed AC waveform is present at input 106, the threshold signal at output 130 is responsive to the disturbance. In one embodiment of the invention, the threshold signal indicates the relationship of at least a portion of each cycle of an input AC waveform relative to a threshold value.

Figure 3:
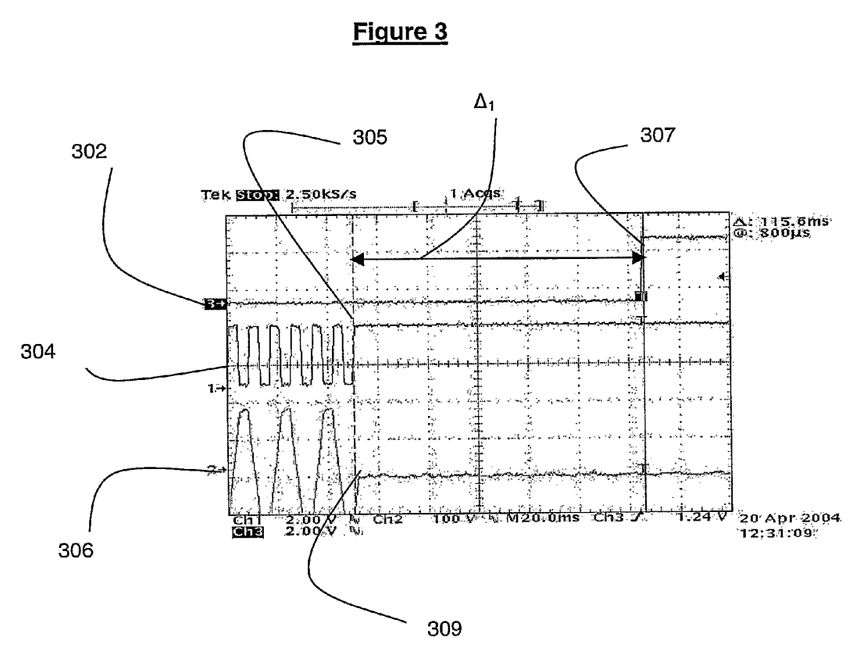
FIG. 3 illustrates waveforms of an electrical device of a detection response of a circuit according to an embodiment of the invention related in time to loss of AC input power and to detection response of the invention relates in time to a waveform of a conventional early power failure (EPF) detection circuit.

In an embodiment of the invention the threshold signal comprises a pulse train provided at an output 130 (for example, pulse train 304 of FIG. 3). In one embodiment, the pulse train comprises pulses corresponding to at least a portion of each cycle of the AC input power waveform. In one embodiment of the invention wherein a 120 Hz pulse train represents an undisturbed 60 cycle AC input waveform, an amplitude decrease below a threshold value, i.e. a disturbance, is detected within one cycle of the input waveform after the disturbance. That is, a disturbance is detected within about 8.33 milli-seconds (ms) or less.

Signal detector and analyzer 150 monitors the threshold signal provided by threshold detector 110. As long as at least a portion each successive cycle of the AC waveform at input 106 exceeds a threshold value, signal detector 150 provides a corresponding indication of undisturbed AC power at output 170. The correspondence of the AC input waveform to pulses of the threshold signal is discussed further below.

In one embodiment of the invention the indication at output 170 of undisturbed AC input power is a logic level signal comprising one of two possible logic states. The presence of the other possible logic state indicates a disturbed AC input power condition. In alternative embodiments of the invention output 170 comprises a plurality of bits representing a code, for example, a status code. In that case, each status code setting represents a corresponding particular disturbance condition of AC input power. Other embodiments of the invention contemplate other formats for a signal at output 170. The invention contemplates a variety of indications and representations of various status conditions and statistical measures related to AC input power. Such representations and status are based on evaluation of the threshold signal at output 130.

Output 170 is provided to other circuits of device 200. In an embodiment of the invention, output 170 is provided to power related safety circuits 198 of device 200. According to one embodiment of the invention, output 170 is provided to a processor 152 controlling memory write operations of a recording device. Upon receipt of an indication of a power disturbance, processor 152 causes any memory operation in progress to complete critical operations. According to an embodiment of the invention, such an indication provides sufficient time for the memory operation to complete critical operations. Furthermore, the indication occurs before the regulated power supply output drops outside of its regulated tolerance limits.

According to one embodiment of the invention, AC power source 105 is a conventional 120V, 60 cycle power source commonly found in households and businesses throughout the United States. However, those of ordinary skill in the art, upon reading the teachings herein, will readily appreciate that the invention is not limited in scope or application to any particular power source AC voltage or frequency. Rather, the invention can be implemented to detect AC power disturbances in any type of AC power signal.

Figure 2:
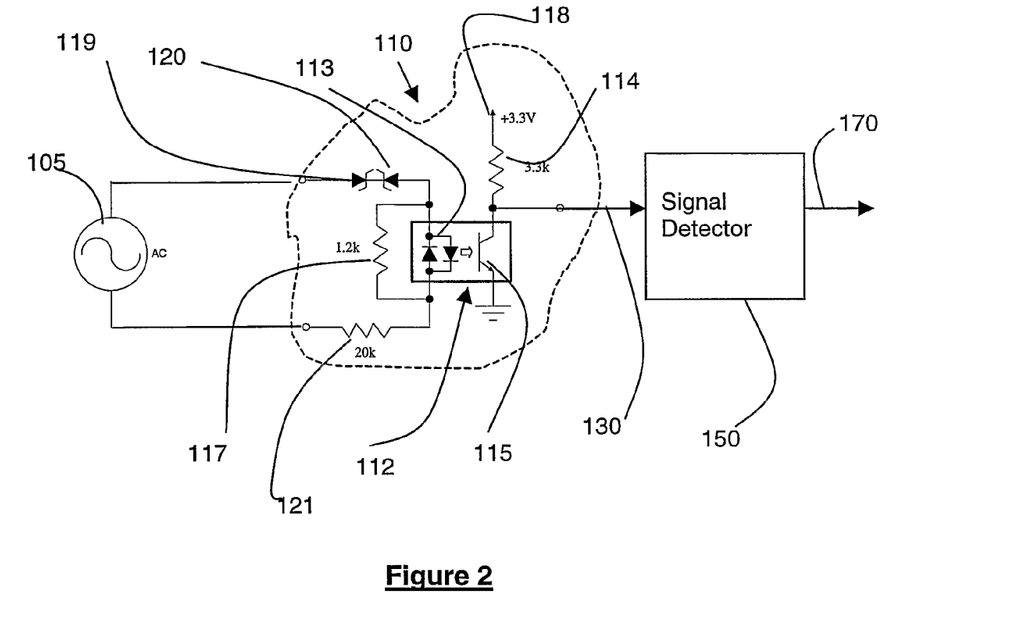
FIG. 2 is a schematic diagram of a power threshold detecting circuit of a power disturbance detection circuit according to an embodiment of the invention.

FIG. 2 is a schematic diagram of a circuit implementing threshold detector 110 of FIG. 1 according to an embodiment of the invention. Threshold detector 110 comprises an optical coupler 112, voltage regulating diodes 119 and 120, and an input current limiting resistance, represented by resistor 121. An optional resistance, represented by resistor 117 is illustrated. Resistor 117 provides additional threshold voltage adjustment. In the embodiment shown, resistor 117 is in parallel with the input of optical coupler 112. In one embodiment of the invention optical coupler 112 comprises a commercially available opto-coupler. One example of a suitable opto-coupler is commercially available from Sharp™, part number PC81410NSZ. In one embodiment of the invention, diodes 107 and 108 comprise Zener diodes. In an embodiment of the invention, Zener diodes 107 and 108 are 100V, 0.5 W Zener diodes.

According to the embodiment of the invention illustrated in FIG. 2, threshold detector 110 provides a 120 Hz pulse train at output 130. In an embodiment of the invention, the pulses comprise logic-level pulses. (e.g., about 3.3V Vcc indicated at 118). The pulse train is generated by detector 110 based upon an incoming 60 Hz 120 VAC waveform.

For purposes of illustration an embodiment of the invention wherein the AC power input normally is 120 VRMS alternating at 60 cycles per second is described below. In this example, the desired threshold is 70 VRMS. According to FIG. 2, AC power source 105 is applied across opto-coupler 112. Zener diodes 119 and 120 are place in series relationship to opto-coupler 112 and power source 105. A 20K Ohm resistor limits current through opto-coupler 112. Zener diodes 119 and 120 are each specified to have a 100V peak breakdown voltage rating and a 0.5 W power rating. Optional resistor 117 has a value of 1.2K Ohms.

The general response of Zener diodes to AC voltage is known and need not be discussed here in detail. Zener diodes 119 and 120 prevent current flow through opto-coupler 112 for a portion of an applied AC voltage waveform based on their rated breakdown voltages. According to an embodiment of the invention, threshold detector 110 has a threshold of 100V peak. Therefore current flow is prevented until an input waveform reaches at least about 100 V peak. Current flows through opto-coupler 112 for a portion of each cycle wherein the AC voltage exceeds about 100V peak in both the positive and negative portions of a cycle. Zener diodes 119 and 120 permit current flow through opto-coupler 112 during the portions of an applied AC voltage waveform when the absolute value of the voltage exceeds a threshold. In this case the threshold is 100 V peak. Therefore current flows through optical coupler 112 when applied voltage exceeds +100V peak and falls below −100V peak. A 100 V peak voltage corresponds to about 70V RMS voltage. Current flowing through opto-coupler 112 is coupled to output 130 so as to provide a logic level output signal at 130.

The desired threshold for any given electronic device of the invention is chosen based on a variety of design considerations. These considerations are within the purview of one of ordinary skill in the art. Therefore, the threshold is capable of adjustment from that of the illustrated circuit. One way of adjusting the threshold is to remove or change the value of resistor 117. Another way is to choose other breakdown voltage values for Zener diodes 119 and 120.

In alternative embodiments of the invention, an opto-coupler 112 with single-direction LED 113 can be used. In an embodiment using a single direction LED, an external diode, for example, a silicon diode, is placed in parallel and connected anode-to-cathode and cathode-to-anode with the LED internal to the opto-coupler 112. With a single direction LED output signal 130 comprises a 60 Hz pulse train. Accordingly, a minimum detect time doubles from about 8.33 ms to about 16.66 ms.

Output signal 130 is coupled to signal detector and analyzer 150. According to an embodiment of the invention signal detector and analyzer 150 includes a processor 151. Notably, there are essentially no time constants in threshold detector circuit 110. Therefore, the 120 Hz pulses at output 130 respond substantially immediately to disturbances of the incoming AC voltage. In one embodiment of the invention, components comprising circuit 110 are selected so as to provide a threshold of approximately 65 VRMS.

The 120 Hz pulses are coupled to signal detector and analyzer 150. In one embodiment of the invention, signal detector and analyzer 150 includes a processor 151. According to various embodiments of the invention, processor 151 is embedded in an ASIC or decoder circuit of a receiver. In one embodiment of the invention, signal detector and analyzer 150 responds to a detected disturbance by initiating actions, for example, power-down actions.

In some cases, it is desirable to modify the response time of signal detector and analyzer 150 in relation to the occurrence of transient power disturbances. Some transient power disturbances are harmless. For example, the duration of the disturbance is sometimes shorter than the response time of the regulated power supply output. If disturbance detection circuit 100 responds too quickly, a critical process, e.g. hard drive recording, may be unnecessarily stopped. If circuit 100 responds too slowly, important data may be corrupted if the power fails.

Therefore, according to one embodiment of the invention, the response of detector 150 is adjustable. For example, a factory adjustment sets the response time of signal detector and analyzer 150. In another embodiment, a user sets the response time of signal detector and analyzer 150 via an operator control. In another embodiment of the invention, the response time of signal detector and analyzer 150 is adaptive. That is, processor 151 monitors characteristics of an output of threshold detector 110. For example, the output at 130 of threshold detector 110. Processor 151 initiates one or more actions based on monitored characteristics of the output. An example of one characteristic to be monitored by processor 151 is referred to herein as signal debounce interval. As used herein the term "signal debounce interval" refers to an interval of time during which a plurality of successive transitions below a threshold occurs. In an adaptive embodiment of the invention, processor 151 "learns" to ignore future successive transitions having a debounce interval matching past successive transitions with the same debounce interval. In other words, when past disturbance patterns have not resulted in an out of tolerance regulated supply output, processor 151 takes no action in response to detection of matching disturbance patterns that occur in the future. Upon reading this specification, and understanding the principles of the present invention, programming a processor to identify, or learn, disturbance patterns is within the capability of one of ordinary skill in the programming arts.

In an alternative embodiment of the invention, processor 151 of signal detector and analyzer 150 monitors the pulse train provided by signal detector and analyzer 150 so as to gather and store statistics relating to the frequency of occurrence, duration, and other characteristics of AC disturbances. The statistics are utilized by processor 151 to adapt the actions initiated by signal detector and analyzer 150. For example, processor 151 causes signal detector and analyzer 150 to terminate write operations of a hard drive, based on a learned relationship between past disturbance characteristics and corresponding outcomes for write operations to device 200. In another embodiment signal detector and analyzer 150 initiates actions based on a learned relationship between disturbance characteristics and regulated supply voltage to device 200.

FIG. 3 is a graphical illustration of an EPF signal 302 representative of that generated by a conventional set-top box. The middle trace 304 represents a 120 Hz output 130 from threshold detection circuit 110, of FIG. 1. The bottom trace 306 illustrates a supplied 60 Hz AC power waveform. The difference $\Delta_1$ between conventional EPF warning response pulse 307 and cessation of 60 Hz AC power (indicated at 309) is more than about 100 ms. However, no significant delay occurs between cessation of 60 Hz AC power indicated at 309 and cessation of 120 Hz pulses (indicated at 305). In this embodiment, each complete cycle of 60 Hz AC power signal 306 corresponds to two pulses of 120 Hz detection signal 304. In this manner, detection signal 304 tracks power signal 306 substantially without delay.

Figure 4:
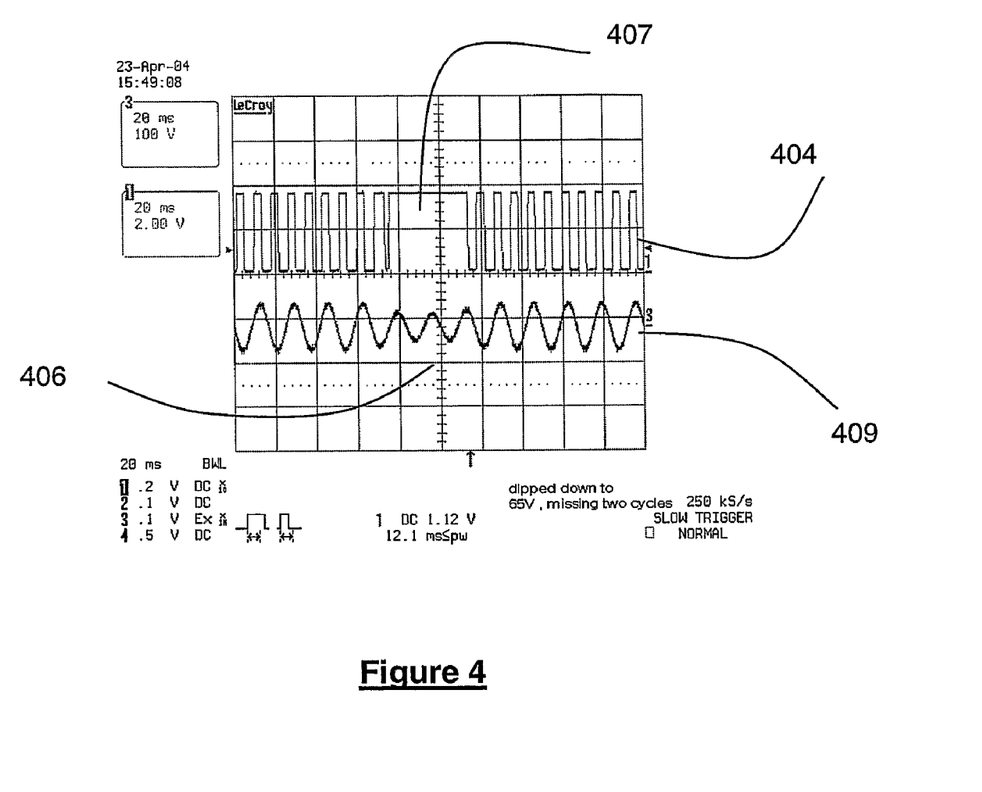
FIG. 4 illustrates waveforms of a detection circuit according to an embodiment of the invention related in time to a transient decrease in AC input voltage to a level below a predetermined detection threshold.

FIG. 4 is a graphical illustration of a threshold signal 404 provided by threshold detection circuit 110 of FIG. 1 according to an embodiment of the invention. As indicated at 406 of FIG. 4, the 60 Hz AC waveform 409 decreases in amplitude from 120 Vrms to 65 Vrms for two cycles and then returns to 120 Vrms. This example depicts a temporary decrease in the 60 Hz AC input voltage. More specifically, input signal 409 decreases to a level below the detection threshold selected for the example circuit of FIG. 2. Since 65 Vrms (91.9Vpeak) is below the threshold of the example circuit, the output 130 of threshold detector 110 goes high during the two cycles 405. The logic high output of threshold detector 110 is illustrated at 407 of FIG. 4.

While power signal 409 is below the threshold, threshold signal 404 remains fixed at a logic level. In other words, pulses of signal 404 cease. When power signal 409 returns to a level above the threshold, pulses of signal 407 reappear.

Figure 5:
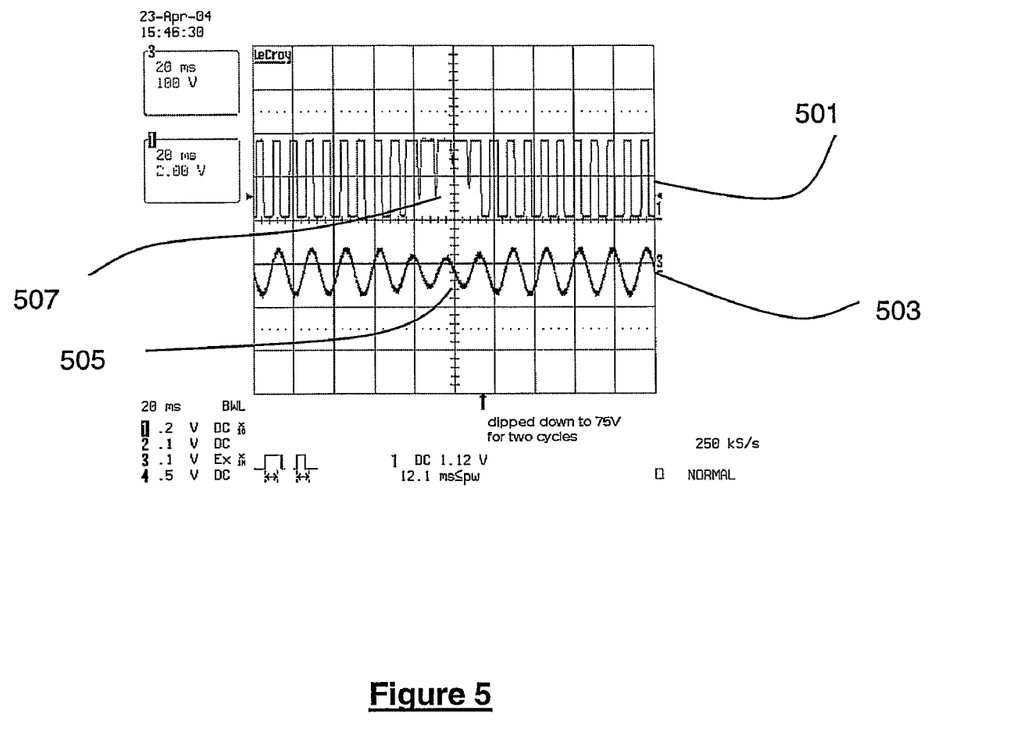
FIG. 5 illustrates waveforms of a detection circuit according to an embodiment of the invention related in time to a transient decrease in AC input voltage to a level approximately equal to the detection threshold.

Similarly, a two-cycle decrease from 120 Vrms to 75 Vrms is depicted in FIG. 5. FIG. 5 illustrates an oscilloscope display of a signal 501 provided by threshold detection circuit 110 of FIG. 1. As indicated generally at 505 of FIG. 5, a transient decrease in AC input voltage occurs. Since 75 Vrms (106Vpeak) is within the threshold region of the circuit, the output at 501 is high during most of the two cycles. However, variations in the form of negative spikes occur at 507.

Figure 6:
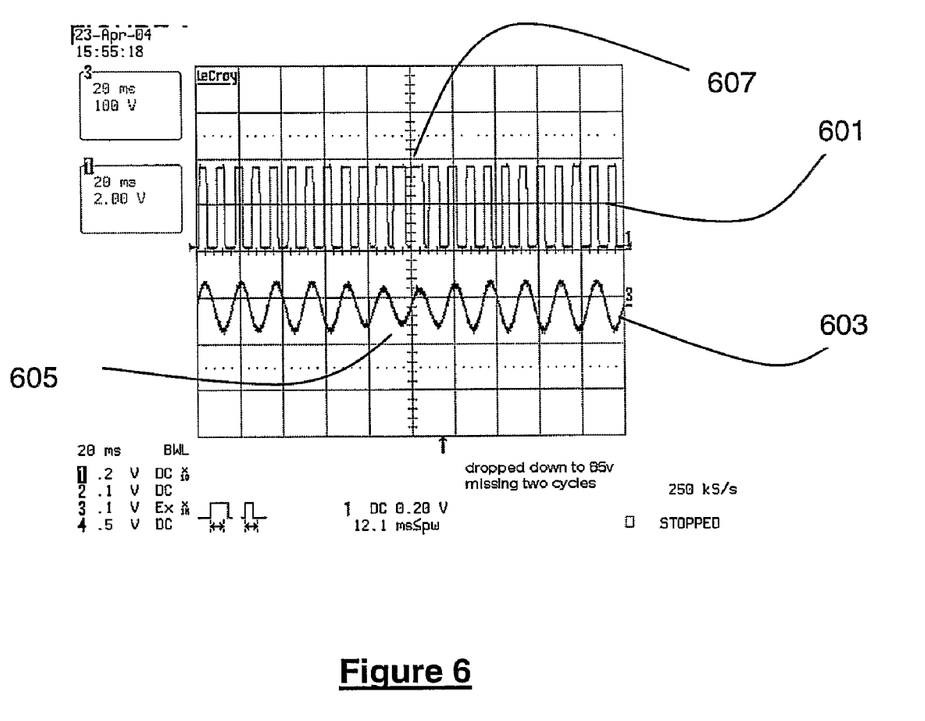
FIG. 6 illustrates waveforms of a detection circuit according to an embodiment of the invention related in time to a transient decrease in AC input voltage to a level above a predetermined detection threshold.

Similarly, a two-cycle decrease from 120 Vrms to 85 Vrms is depicted in FIG. 6. FIG. 6 shows at 601 the output of threshold detector 110 of FIG. 1. Since 85 Vrms (120Vpeak) is above the threshold of the circuit, the output of threshold detector 110 is substantially unchanged during these two cycles.

While foregoing is directed to the preferred embodiment of the present invention, other and further embodiments of the invention may be devised without departing from the basic scope thereof, and the scope thereof is determined by the claims that follow.

The invention claimed is:

1. A method for detecting disturbances in an alternating current (AC) supply input of an electronic device, comprising the steps of;
   providing a signal indicating a relationship between at least a portion of each cycle of a supplied AC input waveform and a threshold value;
   continuously detecting whether said supplied AC input waveform exceeds said threshold value, said signal indicating an undisturbed AC input waveform condition at said supply input when said supplied AC input waveform exceeds said threshold value, and said signal indicating an occurrence of a disturbed AC input waveform condition at said supply input when said supplied AC input does not exceed said threshold value; and
   initiating at least one action based upon at least one occurrence of when said signal indicates said disturbed AC input waveform condition exists at said supply input before regulated voltages of a regulated power supply of the electronic device fall below regulated tolerance limits.

2. The method of claim 1, wherein the step of providing said signal comprises a step of detecting, for each cycle of said supplied AC input waveform, at least a portion of said waveform exceeding said threshold value.

3. The method of claim 2 wherein said indicating signal is comprises a logic level signal.

4. The method of claim 3 wherein said signal comprises a plurality of pulses, each pulse corresponding to at least a portion of a cycle of an AC waveform exceeding said threshold.

5. The method of claim 1, further comprising a step of selecting the electronic device to include a processor configured for controlling memory write operations, said processor upon indication that said signal indicates said occurrence of said disturbed AC input waveform condition at said supply input causes in enough time any memory operations in progress in said electronic device to be completed.

6. The method of claim 1 further comprising a step of analyzing characteristics of said signal comprising:
   gathering statistics related to the frequency of occurrence and duration of each time said signal indicates a disturbed AC input waveform condition at said supply input; and
   initiating said at least one action based on said gathered statistics.

7. A circuit for detecting disturbances in supplied alternating current (AC) provided to an electronic device, comprising:
   a threshold detector having a supply input coupled to a source of said supplied AC;
   said threshold detector having an output providing a signal indicating a relationship of said supplied AC levels to a threshold level for at least a portion of each cycle of said supplied AC, said signal indicating an undisturbed AC input waveform condition at said supply input when said supplied AC level exceeds said threshold value, and said signal indicating at least one occurrence of a disturbed AC input waveform condition at said supply input when said supplied AC level does not exceed said threshold value;
   a signal detector coupled to said threshold detector; and
   said signal detector providing a decision based upon said signal indicating said occurrence of said disturbed AC input waveform condition at said supply input before regulated voltages of a regulated power supply of the electronic device fall below regulated tolerance limits.

8. The circuit of claim 7 wherein the electronic device includes a processor configured for controlling memory write operations, said signal indicating to said processor said occurrence of a disturbed AC input waveform condition at said supply input in enough time for said processor to complete any memory operations in progress in said electronic device.

9. The circuit of claim 7 wherein said threshold detector comprises;
   a voltage regulator configured to conduct current through an optical coupler when voltage of said applied AC waveform exceeds said threshold thereby providing said signal.

10. The circuit of claim 9 wherein said signal comprises logic level pulses.

* * * * *